United States Patent [19]
Davy et al.

[11] Patent Number: 5,506,477
[45] Date of Patent: Apr. 9, 1996

[54] METHOD OF SENSING THE RMS VALUE OF A WAVEFORM

[75] Inventors: Peter G. Davy; Brian G. Cuthbertson, both of London, United Kingdom

[73] Assignee: Multiload Technology Limited, United Kingdom

[21] Appl. No.: 244,107
[22] PCT Filed: Nov. 20, 1992
[86] PCT No.: PCT/GB92/02148
§ 371 Date: May 19, 1994
§ 102(e) Date: May 19, 1994
[87] PCT Pub. No.: WO93/10463
PCT Pub. Date: May 27, 1993

[30] Foreign Application Priority Data

Nov. 22, 1991 [GB] United Kingdom ............ 9124808

[51] Int. Cl.⁶ .................................................. G05F 1/00
[52] U.S. Cl. ............. 315/194; 315/200 R; 315/207; 327/131; 327/348
[58] Field of Search ............... 315/194, 200 R, 315/205, 206, 207; 327/131, 348, 361

[56] References Cited

U.S. PATENT DOCUMENTS

| | | | |
|---|---|---|---|
| 3,384,805 | 5/1968 | Exworthy | 327/348 X |
| 3,564,389 | 2/1971 | Richman | 327/348 X |
| 3,714,570 | 1/1973 | Howell | 327/348 |
| 3,743,949 | 7/1973 | Engel et al. | 327/348 |
| 4,118,641 | 10/1978 | Lannuzel | 307/240 |
| 4,220,989 | 9/1980 | Perilstein | 363/96 |
| 4,245,183 | 1/1981 | Glennon | 327/348 X |
| 4,435,677 | 3/1984 | Thomas | 327/348 X |
| 4,779,007 | 10/1988 | Schlanger et al. | 307/66 |

OTHER PUBLICATIONS

"IC OP-Amp Cookbook" by Walter G. Jung, 1978, pp. 187–189.

Primary Examiner—Robert J. Pascal
Assistant Examiner—Haissa Philogene
Attorney, Agent, or Firm—Beveridge, DeGrandi, Weilacher & Young

[57] ABSTRACT

A method of sensing the rms value of a phase chopped sinusoidal electrical waveform including combining an input signal representative of the waveform with an auxiliary signal in a combining circuit which produces a combining circuit output equal to whichever is the greater of the auxiliary signal and the modulus of the input signal, and averaging the combining circuit output over at least one half cycle of the waveform. The resulting output signal level is representative of the sensed rms value. By making the auxiliary signal equal to the product of a predetermined factor multiplied by a desired value of the output signal level, a feedback signal is produced to allow control of the rms voltage delivered to a load such as a lighting circuit.

11 Claims, 2 Drawing Sheets

METHOD OF SENSING THE RMS VALUE OF A WAVEFORM

BACKGROUND OF THE INVENTION

1. Field of the Invention

This invention relates to a method of sensing the rms value of an electrical waveform and in particular but not exclusively to a method of controlling the rms voltage in a load circuit supplied with a phase chopped sinusoidal voltage waveform.

2. Description of Related Art

The precise measurement of rms (root mean square) values of non-sinusoidal waveforms has hitherto required circuitry which is relatively complex and expensive. A typical analogue circuit computes the rms value by squaring the instantaneous value of input signal, dividing this result by the previously computed rms value and averaging the result to provide an updated rms value. The required linear circuits for the squaring and division calculations result in considerable complexity and expense if satisfactory results are to be produced.

A common circuit requirement is to provide in a load circuit a constant rms supply voltage by regulating a mains supply using a phase chopping device, the phase firing angle at which the sinusoidal mains voltage is chopped being adjusted to regulate the rms power in the load circuit in order to compensate for fluctuations in the amplitude of the mains supply voltage and fluctuations in the load impedance. The present invention seeks to provide a relatively simple method of sensing the rms value of the waveform in such circuits where the shape of the waveform is known to be that of a phase chopped sinusoidal waveform.

SUMMARY OF THE INVENTION

According to the present invention there is disclosed a method of sensing the rms value of a phase chopped sinusoidal electrical waveform comprising the steps of combining an input signal representative of the waveform with an auxiliary signal in a combining circuit which produces a combining circuit output equal to whichever is the greater of the auxiliary signal and the modulus of the input signal, and averaging the combining circuit output over at least one half cycle of the waveform to produce an output signal level representative of the sensed rms value wherein the auxiliary signal is either the product of the output signal level multiplied by a predetermined factor less than unity or is the product of the predetermined factor multiplied by a desired value of the output signal level.

An advantage of such a method is that it is not necessary to provide circuits capable of performing squaring and division.

Preferably the predetermined factor is substantially equal to 78.5% throughout each cycle.

The value of 78.5% has been determined empirically as being appropriate for providing a satisfactory representation of the rms value when processing a waveform which is phase chopped. The term phase chopped is throughout the specification to be understood to mean the modification of a sinusoidal waveform in which the waveform is held constant at zero for a controlled time interval following immediately after each zero crossing point of the waveform, the time interval corresponding to a phase firing angle of a phase chopping device.

Where other forms of chopping of a sinusoidal waveform are employed for power regulation, or where the basic form of the waveform is other than sinusoidal, then other values of the predetermined factor may be empirically determined for use in accordance with the present invention.

Preferably the combining circuit comprises a rectifier producing the modulus of the input signal and also comprises a linear OR function device which combines the modulus of the input signal with the auxiliary signal in the above described manner.

The combining circuit output may conveniently be averaged by a low-pass filter.

Conveniently the auxiliary signal is provided by a control signal equal to the product of the predetermined factor multiplied by a desired value of the output signal level, the method including the step of comparing in a comparator the output signal level with the desired value of output signal level to produce a feedback signal which regulates a phase chopping device to regulate the phase firing angle at which the waveform is chopped.

The above method of sensing the rms value may be incorporated in a method of controlling rms voltage in a load circuit in which the phase chopping device is connected in series with a primary coil of a mains transformer having a secondary coil connected to the load circuit.

The rms value of voltage delivered to the load circuit can therefore be accurately controlled by means of the feedback loop provided by the feedback signal and phase chopping device.

BRIEF DESCRIPTION OF THE DRAWINGS

Embodiments of the present invention will now be described by way of example only and with reference to the accompanying drawings of which.

DESCRIPTION OF A PREFERRED EMBODIMENT OF THE INVENTION

Figure 1:
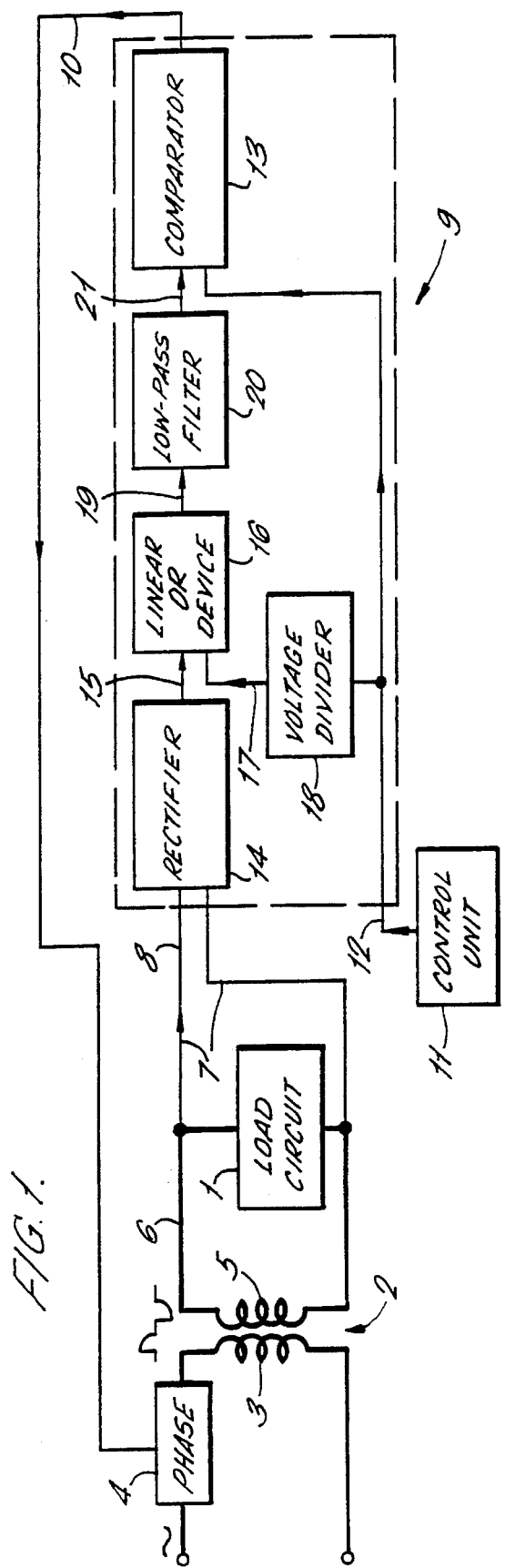
FIG. 1 is a schematic circuit layout illustrating a method of controlling rms voltage in a load circuit.

In FIG. 1 a load circuit 1 of a low voltage lighting system is supplied with phase chopped sinusoidal voltage by means of a transformer 2 having a primary coil 3 connected to a phase chopping device 4. The load circuit 1 is connected remotely from a secondary coil 5 of the transformer 2 by a supply line 6 and sensor wires 7 are connected to the supply line adjacent to the load circuit 1.

Sensor wires 7 carry an input signal 8 to a sensing circuit 9 (outlined in broken lines in FIG. 1) which produces a feedback signal 10 supplied to the phase chopping device 4 in order to regulate the phase firing angle at which the voltage supply is regulated.

A control unit 11 is provided with means for setting a desired level of rms voltage to be delivered to the load circuit 1 and produces a control signal 12 which is input to a comparator 13 of the sensing circuit 9.

The value of the control signal is set to a level which corresponds to that output of the output signal level 21 which is representative of the desired rms voltage.

The sensing circuit 9 has an active rectifier 14 which rectifies the input signal 8 to produce a rectified output signal 15 which is then input to a linear OR device 16. An auxiliary signal 17 is derived from the control signal 12 by action of a voltage divider 18 which reduces the signal to 78.5% of the control signal and the auxiliary signal is then input to the linear OR device 16.

Figure 2:
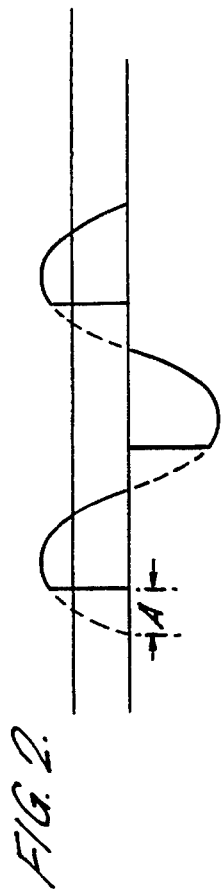
FIG. 2 shows a phase chopped waveform and auxiliary signal.
Figure 3:
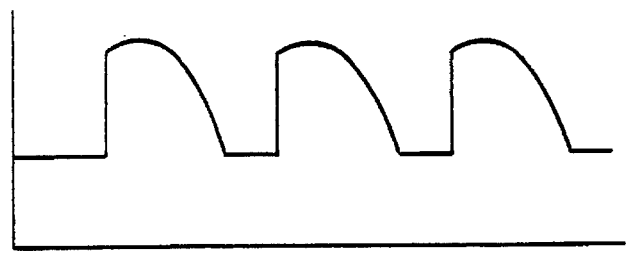
FIG. 3 shows a corresponding output of a linear OR function device of a sensing circuit.

The linear OR device 16 together with the rectifier 14 constitute a combining circuit which produces a combining circuit output 19 illustrated in FIG. 3. FIG. 2 shows the input signal 8 before being rectified. The combining circuit output 19 follows the input signal only where the input signal is greater than the level of the auxiliary signal 17. When the input signal 8 falls below the level of the auxiliary signal 17 then the output 19 is made equal to the level of the auxiliary signal.

The combining circuit output 19 is averaged by means of a low-pass filter 20 having a long time constant relative to the period of the waveform to produce an output signal level 21 which is input to the comparator 13.

The output signal level 21 is representative of the rms value of the input signal 8 to a good approximation. Typically the phase firing angle A as illustrated in FIG. 2 varies between 30° and 150° and a good approximation is maintained within this operating range.

It has been found that in a practical system for controlling rms voltage in a load circuit 1 the above method provides satisfactory results without the need for complex squaring and dividing circuitry.

In the event of amplitude fluctuation in the mains supply the instantaneous input signal 8 increases or decreases in amplitude resulting in an increase or decrease in the output signal level 21. Comparator 13 then generates an error signal or feedback signal 10 which commands the phase chopping device 4 to reduce or increase the power delivered to the primary coil 3 by respectively increasing or decreasing the phase firing angle A until the error signal or feedback signal 10 is nulled.

In a typical example the load circuit 1 consists of a 12 volt lighting circuit in which a number of lamps are connected in parallel with the supply line 6. In the event of open-circuit failure of one of these lamps the impedance presented to the secondary coil 5 is increased and the input signal 8 will increase accordingly. The comparator 13 operates to provide a suitable feedback signal 10 to decrease the power supply by increasing the phase firing angle A until the feedback signal is nulled.

An alternative embodiment will now be described with reference to FIG. 4 where corresponding reference numerals to those of preceding Figures are used where appropriate for corresponding elements.

Figure 4:
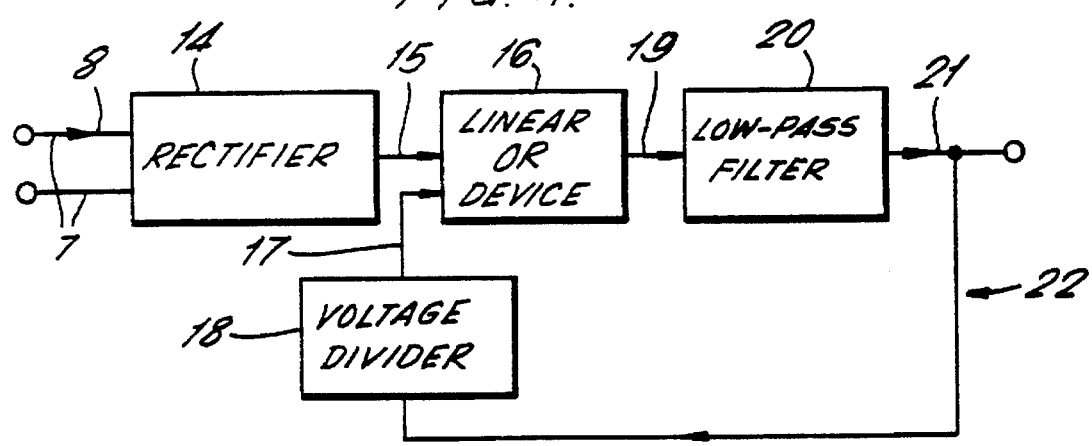
FIG. 4 is a schematic circuit layout of an alternative embodiment for monitoring the rms value of voltage in a circuit.

In FIG. 4 an alternative sensing circuit 22 is arranged to receive an input signal 8 and generate output signal level 21 as representative of the rms value of the input signal waveform. The input signal 8 is rectified by rectifier 14 to provide a rectified output signal 15 which in turn is input to linear OR device 16. Also input to the linear OR device 16 is auxiliary signal 17 which is 78.5% of the output signal level 21, this reduction being provided by voltage divider 18.

The combining circuit output 19 from the combining circuit 14,16 is averaged by means of a low-pass filter 20 to form the output signal level 21. The output signal level 21 provides to a good approximation a representation of the rms value of the input signal 8 and can be used to drive an indicator device such as a meter or may be used to control any other suitable device as may be required.

The combining circuit output 19 may alternatively be averaged by means of an integrator operable to integrate the output over at least one half cycle of the waveform.

The linear OR function may be replaced by other suitable linear devices provided that the combining circuit achieves the same result as described above with reference to FIG. 3.

The above embodiments are designed to operate satisfactorily for variation in phase firing angle between approximately 30° and 150°. If it is required for the circuit to operate where the phase firing angle varies also between 0° and 30° and between 150° and 180° then a modification to the circuit may be required to improve accuracy. This is because, when the phase firing angle is within the range 0° to 30° or 150° to 180°, the instantaneous values of the waveform are less than the steady value of the auxiliary signal so that any fluctuation in phase firing angle does not result in a corresponding change in the combining circuit output 19. To correct this error the constant voltage level of the auxiliary signal 17 can be replaced by an auxiliary waveform which varies during each half cycle of the waveform, the auxiliary waveform being selected to have a shape which gives a combining circuit output which when averaged provides a truer representation of the rms value for all phase firing angles.

We claim:

1. A method of sensing the rms value of a phase chopped sinusoidal electrical waveform comprising the steps of:

combining an input signal representative of the waveform with an auxiliary signal in a combining circuit, which combining circuit produces a combining circuit output equal to whichever is the greater of the auxiliary signal and the modulus of the input signal, and averaging the combining circuit output over at least one half cycle of the phase chopped sinusoidal waveform to produce an output signal level representative of the sensed rms value, wherein the auxiliary signal is the product of a predetermined factor less than unity multiplied by a control signal produced by means for setting a desired level of rms voltage of the output signal.

2. A method of sensing the rms value as claimed in claim 1 wherein the predetermined factor is substantially equal to 78.5% throughout each cycle.

3. A method of sensing an rms value as claimed in claim 1 wherein the combining circuit comprises a rectifier producing the modulus of the input signal.

4. A method of sensing an rms value as claimed in claim 1 wherein the combining circuit comprises a linear OR function device.

5. A method of sensing an rms value as claimed in claim 1 wherein the combining circuit output is averaged by means of a low-pass filter.

6. A method of controlling rms voltage in a load circuit in which the rms value of a voltage waveform in the load circuit is sensed as claimed in claim 1, the method further including the step of comparing in a comparator the output signal level with the level of the control signal to produce a feedback signal which regulates a phase chopping device to regulate the phase firing angle at which the waveform is chopped.

7. A method of controlling rms voltage as claimed in claim 6, the phase chopping device being connected in series with a primary coil of a mains transformer having a secondary coil connected to the load circuit.

8. A method as claimed in claim 7 in which the input signal is obtained by sensing a voltage supplied to the load circuit at a location adjacent to a load device of the load circuit.

9. A method as claimed in claim 7 wherein the load circuit is a low voltage lighting circuit.

10. A method of sensing an rms value as claimed in claim 1 wherein the control signal is set to a level which corresponds to a value of the output signal level which is representative of the desired level of rms voltage.

11. A method of sensing an rms value as claimed in claim 1 wherein the auxiliary signal has a waveform which varies each half cycle of the phase chopped sinusoidal electrical waveform.

* * * * *